(12) United States Patent
Kinoshita

(10) Patent No.: US 9,152,741 B2
(45) Date of Patent: Oct. 6, 2015

(54) THREE-DIMENSIONAL SHAPE GENERATION METHOD, PROGRAM, AND RECORDING MEDIUM

(71) Applicant: Sony Corporation, Tokyo (JP)

(72) Inventor: Takashi Kinoshita, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 327 days.

(21) Appl. No.: 13/713,365

(22) Filed: Dec. 13, 2012

(65) Prior Publication Data

US 2013/0185025 A1    Jul. 18, 2013

(30) Foreign Application Priority Data

Jan. 17, 2012 (JP) ................................. 2012-006749

(51) Int. Cl.
*G06F 7/60* (2006.01)
*G06F 17/10* (2006.01)
*G06F 17/50* (2006.01)

(52) U.S. Cl.
CPC ................ *G06F 17/50* (2013.01); *G06F 17/10* (2013.01); *G06T 2210/21* (2013.01)

(58) Field of Classification Search
CPC ......... G06F 17/50; G06T 19/00; G06T 17/10; G06T 17/00; G06T 2210/21
USPC ..................... 703/1; 700/97–98; 345/419–420
See application file for complete search history.

(56) References Cited

U.S. PATENT DOCUMENTS

| | | | | |
|---|---|---|---|---|
| 5,367,465 A | * | 11/1994 | Tazawa et al. | 700/98 |
| 6,120,171 A | * | 9/2000 | Shaikh | 700/98 |
| 6,215,493 B1 | * | 4/2001 | Fujita | 345/418 |
| 6,593,926 B1 | * | 7/2003 | Yamaguchi et al. | 345/427 |
| 6,628,279 B1 | * | 9/2003 | Schell et al. | 345/420 |
| 7,116,341 B2 | * | 10/2006 | Ohto | 345/619 |

FOREIGN PATENT DOCUMENTS

| | | |
|---|---|---|
| JP | 06-028429 | 2/1994 |
| JP | 10-041366 | 2/1998 |
| JP | 2000-160336 | 6/2000 |
| JP | 2004-327810 | 11/2004 |
| JP | 2007-123485 | 5/2007 |
| JP | 2008-244293 | 10/2008 |

OTHER PUBLICATIONS

Z. Esso, et al., "3D TCAD Simulation of Advanced CMOS Image Sensors," IEEE, pp. 187-190, France.

* cited by examiner

*Primary Examiner* — Eunhee Kim
(74) *Attorney, Agent, or Firm* — Hazuki International, LLC

(57) ABSTRACT

There is provided a method of generating a three-dimensional (3D) shape by specifying a boundary between materials, including acquiring numerical data of a boundary line of a two-dimensional (2D) shape in a plane, generating a next 2D shape by moving the 2D shape in a direction intersecting the plane based on numerical data specifying a shape of the boundary and also by copying or deforming the 2D shape, and configuring a solid based on data of a generated 2D shape.

8 Claims, 6 Drawing Sheets

7A  7B

THREE-DIMENSIONAL SHAPE GENERATION METHOD, PROGRAM, AND RECORDING MEDIUM

BACKGROUND

The present technology relates to a three-dimensional (3D) shape generation method, a program for causing a computer to execute the 3D shape generation method, and a recording medium recording the program.

When semiconductor apparatuses are designed, process simulations or device simulations are used for the purpose of saving design time or reducing prototyping or manufacturing costs.

In the process simulations, the shape of a surface or interface and the movement or deterioration of a material included in a semiconductor apparatus associated with a manufacturing process are reproduced on a computer according to a specified physical law.

In the device simulations, characteristics of electronic elements are reproduced on a computer by adding electrical operation conditions for a shape or material distribution determined by the process simulations.

In the process simulations, a series of process steps of manufacturing the semiconductor apparatus are reproduced on the computer. The process steps include deposition (adding a material to a surface), etching (removing a material from a surface), lithography (specifying a surface processing region), and other processes.

The process simulations are roughly classified into shape (topography) simulation and bulk process simulation.

The topography simulation is used for simulations of process steps such as deposition, etching, and lithography, and related to a change in a shape of a material including a semiconductor wafer.

The bulk process simulation can be used for simulations of process steps mainly related to redistributions of dopant impurities among semiconductor elements such as diffusion, ion implantation, oxidation, and the like.

One of the purposes of the process simulations is to create a computer representation of a microscopic structure formed on a wafer surface and use the computer representation in bulk process simulation, device simulation, and other analysis programs.

According to the device simulations or other analysis programs, characteristics such as electrical characteristics, temperature characteristics, and mechanical characteristics of a semiconductor apparatus can be calculated.

An operation of an element constituting the semiconductor apparatus is specified by a shape and composition distribution of a microscopic structure formed on a wafer surface.

Technology for accurately performing a predictive calculation of a shape of the microscopic structure obtained as the result of the processes of etching, deposition, and lithography has been developed so far.

In addition, a method of representing a shape of a surface or interface on a computer is also shown in several types.

Representative shape-describing methods adopted for the shape simulation, for example, are a cell model (for example, see Japanese Patent Application Publication No. 2007-123485), a network model, a diffusion model, and a string model (for example, see Japanese Patent Application Publication No. 2000-160336).

In the device simulations or other analysis programs, a set (analysis mesh) of coordinate points on which numerical analysis is performed is generated from a shape-describing format. Because the analysis mesh specifies the precision of physical simulations of an operation of an element, it is necessary to reproduce an actual shape of an element on the computer with high precision, that is, it is necessary to precisely represent a 3D curved surface of a boundary and surface between materials.

However, the cell model, the network model, the diffusion model, and the string model described above all have a limitation in precisely representing a 3D curved surface of a boundary and surface between materials.

In terms of problems of the above-described models, attempts to initially specify a shape-describing format suitable for highly precise analysis in an analysis program and then construct a simulation method for the specified shape-describing format have been reported (for example, see Japanese Patent Application Publication No. H6-28429).

In Japanese Patent Application Publication No. H6-28429, a method of extending a well-known solid modeling function and performing process simulations in manufacturing of a semiconductor apparatus is disclosed.

In addition, several methods of describing a shape using solid modeling have been proposed (for example, see Japanese Patent Application Publication Nos. 2004-327810, H10-41366, and 2008-244293).

The solid modeling traditionally means a 3D shape generation method and program adopted for a computer-aided design (CAD) tool, and enables an inherently substantially static physical structure such as a building to be easily designed or assembled.

SUMMARY

However, in the methods proposed in Japanese Patent Application Publication Nos. 2004-327810, H10-41366, and 2008-244293, a cross-sectional surface is rectangular and hence it is difficult to reproduce a detailed and complex curved-surface shape.

In addition, in the recently published Non-Patent Literature "3D TCAD Simulation of Advanced CMOS Image Sensors, 2011 International Conference on Simulation of Semiconductor Processes and Devices (SISPAD), 187-190," a 3D shape is configured as a shape based on a rectangle and a detailed 3D shape is not reproduced.

It is desirable to provide a 3D shape generation method by which a 3D shape having a detailed and complex curved-surface shape can be reproduced. In addition, it is desirable to provide a program for executing the generation method and a recording medium recording the program.

A 3D shape generation method of the present technology is a method of generating a 3D shape by specifying a boundary between materials.

First, the 3D shape generation method includes acquiring numerical data of a boundary line of a two-dimensional (2D) shape in a plane.

Next, the 3D shape generation method includes generating the next 2D shape by moving the 2D shape in a direction intersecting the plane based on numerical data specifying a shape of the boundary and also by copying or deforming the 2D shape.

Further, the 3D shape generation method includes configuring a solid based on data of each generated 2D shape.

The 3D shape is generated in these steps.

A program of the present technology is a program that causes a computer to implement and execute the following processes. The processes include the processes of (1) acquiring numerical data of a boundary line of a 2D shape in a plane, (2) generating the next 2D shape by moving the 2D shape in a direction intersecting the plane based on numerical data specifying a shape of a boundary and also by copying or deforming the 2D shape, and (3) configuring a solid based on data of each generated 2D shape.

A recording medium of the present technology is a computer-readable recording medium storing the above-described program of the present technology.

In accordance with the present technology described above, the next 2D shape is generated by moving the 2D shape and also copying or deforming the 2D shape, and the solid is configured based on the data of each generated 2D shape.

Thereby, it is possible to reduce an amount of data for configuring a solid and represent the solid having a detailed and complex curved surface.

In accordance with the above-described present technology, because it is possible to reduce an amount of data for configuring a solid and represent a solid having a detailed and complex curved surface, various analyses can be executed for a short calculation time without loss of shape precision in a follow-up analysis program.

DETAILED DESCRIPTION OF THE EMBODIMENT(S)

Figure 1:
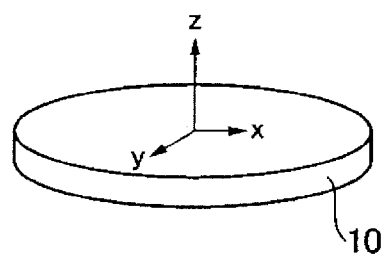
FIG. 1 is a diagram illustrating coordinate axes set on a surface of an initial wafer.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Hereinafter, best modes (hereinafter referred to as embodiments) for carrying out the present technology will be described.

Description will be given in the following order.
1. Overview of Present Technology
2. Embodiments 1. Overview of Present Technology The overview of the present technology will be described first before describing specific embodiments.

Hereinafter, the present technology will be described in detail including assumptions leading to the development of the present technology such as the above-described Background or Summary.

As described above, in shape simulations, a cell model, a network model, a diffusion model, and a string model are adopted as a representative shape-describing method.

As described in Japanese Patent Application Publication No. 2007-123485, the cell model has a configuration in which a 3D section serving as a target is divided into equally spaced cells and each cell holds a numerical index indicating a material in its position.

Because it is possible to represent the movement of a surface based on a physical phenomenon by rewriting the numerical index held by each cell if the cell model is adopted for the shape simulations, consistency with physical simulations is high and it is easy to create an analysis program. Thus, the cell model is adopted for many shape simulation programs.

On the other hand, because cells are formed in equally spaced rectangular shapes in the cell model from the point of view of the shape format, a shape recognition processing calculation is necessary to sufficiently represent a boundary or surface between materials that are complexly changed. However, this calculation technology is not implemented. Even when the calculation technology is implemented, a calculation time is significantly increased from characteristics of recognition processing.

The network model is an improvement of the cell model, and each point of the surface is defined on each edge of a surface tetrahedron cell.

The diffusion model is also an improvement of the cell model, and uses a concentration contour to define a surface.

Thus, even in the network model and the diffusion model as the shape-describing format, as in the cell model, it is known to be difficult to accurately treat a curved surface occurring during a process step.

As described in Japanese Patent Application Publication No. 2000-160336, the string model represents a boundary between materials or mainly a surface shape itself in a divided line (string), and each string is moved according to a physical analysis result. As a shape representation method, the string model is better than the cell model.

However, the string model may have an invalid crossover structure in which strings calculated in time steps when a shape changes overlap. Although technology for correcting such an invalid crossover structure has also been developed, a calculation time is significantly increased because of a significantly complex calculation in an actual semiconductor manufacturing process.

In Japanese Patent Application Publication No. H6-28429, shape simulations are implemented by extending a solid modeling function and applying the extended solid modeling function to dynamic deformation occurring in a material layer within a semiconductor wafer according to a process step.

In the solid modeling, a solid is defined as a set of structure elements.

In addition, in a general solid modeling, a new solid or a re-defined solid is created by combining one or more solids.

As a tool for performing the solid modeling, Geometric Work Bench (GWB) available from the Helsinki University of Technology is disclosed.

In a method of extending the solid modeling function, trajectory solids are generated based on the solid modeling function as disclosed in Japanese Patent Application Publication No. H6-28429. According to a rate of etching or deposition of the process step, the structure is changed. The deformation of a material solid is completed by executing a Boolean set operation on the material solid and a trajectory solid.

However, this method is aimed at simulating the shape evolution of a film forming surface from a base shape in solid formation, and is not applied to other processes, particularly, simulation of a shape specified by a mask layout, not a base.

As disclosed in Japanese Patent Application Publication No. H6-28429, the shape-describing method based on the solid modeling is effective as the transfer of a shape for its subsequent-stage bulk process simulation and device simulation and analyses of other analysis programs.

However, a physical model and a chemical reaction model treated in process simulations are different from each other. Thus, in reality, even when all shape simulation results are implemented in the same solid model, there is a technical difficulty.

In order to prevent the precision of shape simulations from being degraded, the reduction of a calculation time and the precision are secured using a program suitable for a calculation technique and only the conversion of a shape-describing format into a solid model in which an analysis mesh of an analysis program is easily generated is independently executed. Thereby, this method is most efficient because it is possible to generate a shape format effective for a subsequent-stage analysis program for various analyses.

The above-described cell model and string model are included as a program suitable for the calculation technique. The analysis program includes Basque process simulation, device simulation, and other analysis programs.

In addition, technology for obtaining a coordinate set of a 3D structure by measuring an actual microscopic structure using an electron microscope and the like as well as the shape simulations for some shapes has been developed.

It is necessary to generate integrated shape-describing data including data obtained by the shape simulations or actually measured data.

Considering characteristics of a shape in a semiconductor process, the shape is described according to the specification of a shape change position within a plane parallel to a surface of an initial wafer and the specification of a position of an interface or surface in each coordinate position perpendicular to the initial wafer surface.

Usually, the specification of the shape change position within the plane parallel to the initial wafer surface is numerically specified as a 2D closed graphic set (mask layout) within the plane parallel to the initial wafer surface. The result of the lithography process is added, so that a final shape is specified. This final shape can be digitized by shape simulation of lithography or measurement by the electron microscope and the like.

The specification of the interface or surface is specified in an end portion of the final shape of the base structure and the mask layout in each coordinate position perpendicular to the initial wafer surface, and a change due to the result of etching and deposition processes is added, so that a final shape is specified. This final shape can be digitized by shape simulation of etching or deposition or measurement by the electron microscope or the like.

2D shape data as the final result of the lithography process and one-dimensional (1D) shape data as the final result of the etching or deposition process are extracted from simulation and measurement. Using the extracted data, a shape is described based on solid modeling.

This method can realize better integrity in the entire semiconductor design system.

For a method of designing a semiconductor element based on such a concept, a method of implementing a 3D shape by offsetting a mask layout by a size corresponding to a film thickness is disclosed in Japanese Patent Application Publication No. 2004-327810. However, in this method, it is difficult to reproduce a complex shape because a cross-sectional surface is rectangular.

Likewise, in Japanese Patent Application Publication No. H10-41366, a method of producing a laminated shape from a mask layout and film-thickness information using the result obtained by measuring a shape of an actual wafer surface has been proposed. However, only a concept is described, and no specific method is disclosed.

In Japanese Patent Application Publication No. 2008-244293, a method of obtaining a desired shape by describing a position of an interface or surface in each coordinate position perpendicular to a surface of an initial wafer within a 2D surface, and linearly extending the described position in a direction perpendicular to the 2D surface is disclosed.

This method is considered to be most practical as a shape-describing method based on solid modeling used in general computer-aided engineering (CAE).

In the methods proposed in Japanese Patent Application Publication Nos. 2004-327810, H10-41366, and 2008-244293 and Non-Patent Literature "3D TCAD Simulation of Advanced CMOS Image Sensors, 2011 International Conference on Simulation of Semiconductor Processes and Devices (SISPAD), 187-190," it is difficult to reproduce a detailed 3D shape on a computer because a 3D shape is configured as a shape based on a rectangle. Thus, element characteristics obtained through analysis by an analysis program may be different from actual element characteristics.

Here, a method of reproducing a detailed 3D shape for the intended purpose on the computer based on Japanese Patent Application Publication No. 2008-244293, which is the shape-describing method based on the solid modeling system used in the above-described general CAE, will be described.

For description, as illustrated in FIG. 1, it is assumed that coordinate axes parallel to a surface of an initial wafer 10 are an x-axis and a y-axis and a coordinate axis perpendicular to the surface of the initial wafer 10 is a z-axis.

Figure 2:
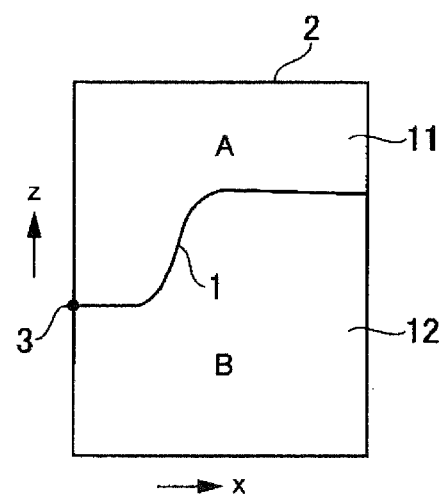
FIG. 2 is a diagram illustrating a position of an interface specified in a plane perpendicular to the surface of the initial wafer.

Among detailed 3D shapes, the specification of the position of the interface or surface in each coordinate position perpendicular to the surface of the initial wafer 10 is defined as a 1D curve 1 within a plane 2 of a certain area of an xz-plane as a boundary between a first layer (material A) 11 and a second layer (material B) 12, for example, as illustrated in FIG. 2.

On the other hand, the specification of the shape change position within the plane parallel to the initial wafer surface is numerically specified as the 2D closed graphic set (mask layout) within the plane parallel to the initial wafer surface as described above, and is usually a set of closed polygons.

However, a change due to the result of the lithography process is added, and hence a final shape that is rounded is generally obtained for the mask layout. For example, as illustrated in FIG. 3, the final shape is specified as a curve 4 within an xy-plane.

An actual solid can be described, for example, as described hereinafter.

Figure 4:
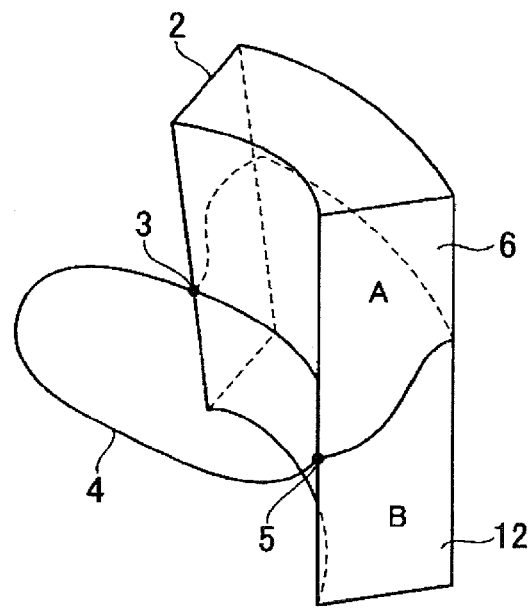
FIG. 4 is a diagram illustrating a solid formed as a trajectory of movement of the curve of FIG. 3.

As illustrated in FIG. 4, for example, a normal line of the plane 2 is moved parallel to a tangent line of the curve 4 by causing one end point 3 of the curve 1 indicating the boundary of FIG. 2 to be consistent with the curve 4 within the xy-plane. Thereby, in the solid formed as the trajectory of movement, a shape can be described as a boundary plane between the first layer (material A) 11 and the second layer (material B) 12.

Figure 3:
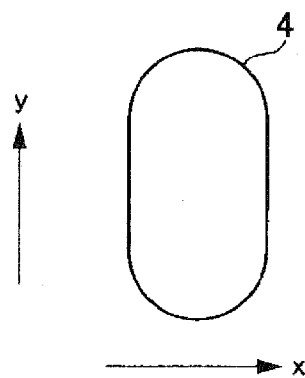
FIG. 3 is a plan view illustrating a curve of a mask layout.

However, in general, in many process steps such as an embedding process for a hole shape, it is necessary to form a similar interface, for example, inside the curve 4 of the mask layout of FIG. 3, as the process result.

In this case, a problem will be described with reference to FIG. 5.

Figure 5:
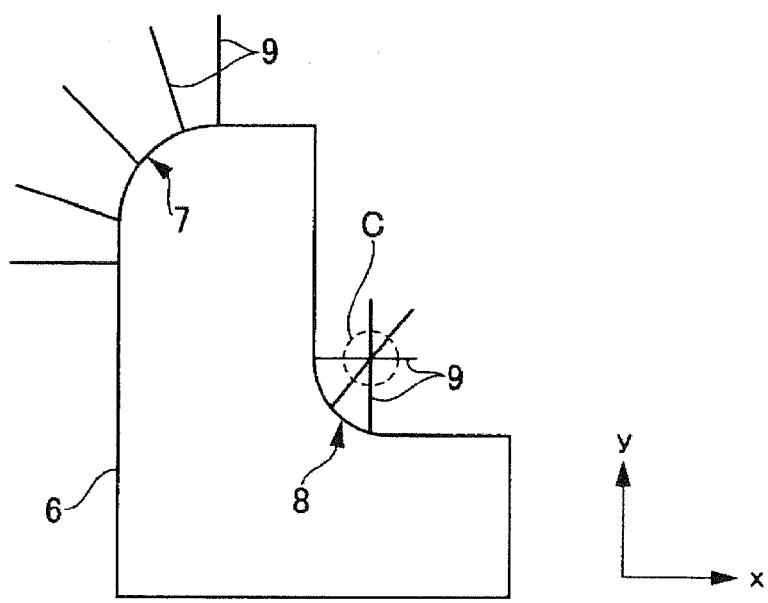
FIG. 5 is a diagram illustrating a problem when a projecting curve portion is provided on the inside.

FIG. 5 is a diagram illustrating a wafer surface viewed in a z-direction. In FIG. 5, a curve 6 of the mask layout corresponding to the curve 4 of the mask layout of FIG. 3 is described, and the plane 2 specifying a cross-sectional shape of FIG. 2 is represented as a short straight line 9 extending from the curve 6.

The curve 6 has a linear portion, a projecting first curve portion 7 on the outside, and a recessed second curve portion 8 on the inside.

When a 3D shape is formed along a projecting curve on the outside as in the first curve portion 7 of FIG. 5, the 3D shape can be generated using a function of a solid modeling system in a state in which straight lines 9 corresponding to the plane 2 of FIG. 2 do not intersect each other.

On the other hand, when a 3D shape is formed along a recessed curve on the outside as in the second curve portion 8 of FIG. 5, straight lines 9 corresponding to the plane 2 of FIG. 2 may intersect each other in an area C surrounded by a dotted line. At this time, as a function of the solid modeling system, an error is output for stop or a curved surface is newly synthesized and output.

However, the curved surface newly synthesized and output here may be completely different from a shape of an actual curved surface, and hence the result obtained by the shape simulation may be ineffective.

The present technology is aimed at reproducing a 3D shape having a detailed and complex curved-surface shape.

It is possible to implement a solid model in which an analysis mesh is easily generated within bulk process simulation, device simulation, and other analysis programs by enabling the 3D shape having the detailed and complex curved-surface shape to be reproduced.

The present technology provides a method of generating a 3D shape by specifying a boundary between materials.

In the present technology, the 3D shape is generated using numerical data of a 1D cross-sectional surface pre-measured or calculated in low dimension and numerical data of a 2D shape such as a mask layout.

Specifically, the present technology first includes the step of acquiring numerical data of a boundary line of a 2D shape in a plane (for example, a mask layout in a plane parallel to a substrate).

The present technology includes the step of moving the 2D shape in a direction intersecting the above-described plane, that is, a direction not parallel to the plane, based on numerical data specifying a shape of a boundary between materials, and generating the next 2D shape by copying or deforming the 2D shape.

Further, the present technology includes the step of configuring a solid based on data of each generated 2D shape.

The present technology basically uses solid modeling.

The 3D shape is generated in the solid modeling by obtaining a wireframe according to moving and copying or deforming of the 2D shape and processing and synthesizing the wireframe.

Thereby, because it is possible to significantly reduce an amount of data representing the solid as compared with the case in which a set of points of a surface of a solid is made, a calculation time can be shortened when data of the 3D shape has been used in an analysis program.

In addition, it is possible to reproduce a 3D shape having a detailed and complex curved-surface shape, which is difficult to represent in the method of configuring the 3D shape based on the rectangle proposed in the related art.

The "plane" in the present technology, for example, includes a substrate surface (a main surface of a substrate) of a semiconductor apparatus or the like, a horizontal plane, a plane perpendicular to the horizontal plane, and a plane (diagonal plane) diagonal to the horizontal plane.

The "2D shape" is a 2D shape (a cross-sectional shape in the above-described plane), which constitutes a 3D shape to be generated, such as the above-described mask layout.

The "boundary line" of the 2D shape is a closed edge shape of the boundary of the 2D shape. For example, when the 2D shape is an island shape, an outer circumferential line is the boundary line. For example, when the 2D shape is a mask layout of a cutout pattern, an inner circumferential line is the boundary line.

It is desirable to acquire numerical data of a boundary line of a 2D shape positioned at a farthest end in a cross-sectional shape in the above-described plane of the 3D shape to be generated in an initial step by moving a 2D shape from the next step.

In the next step, the 2D shape is moved in a direction intersecting the above-described plane based on numerical data specifying a shape of a boundary between materials.

The "numerical data specifying the shape of the boundary between the materials" corresponds to numerical data indicating a position of a sidewall portion in the 2D shape in the boundary between the materials constituting the solid to be generated.

The direction intersecting the plane is a direction not parallel to the plane as described above.

In particular, when the direction in which the 2D shape is moved is designated as a direction perpendicular to the plane, an amount of data of the 3D shape to be generated can be reduced.

On the other hand, when the solid to be generated is a solid formed by processing or development in a direction diagonal to the plane, it is preferable to move the 2D shape in the diagonal direction.

In the step of moving the 2D shape, the next 2D shape is generated by moving and also copying or deforming the 2D shape.

When the next 2D shape is the same shape, the 2D shape is moved and also copied.

When the next 2D shape is a different shape, the 2D shape is moved and also subjected to necessary deformation. For example, in the case of a similar shape having a different size, reduction deformation or enlargement deformation is performed. On the other hand, in the case of a dissimilar shape, necessary deformation is performed in line with an actual 3D shape.

In the step of configuring the solid based on data of each generated 2D shape, specifically, the 3D shape is generated by obtaining a wireframe from data of each 2D shape and processing or synthesizing the wireframe.

The present technology further includes the step of calculating the configured solid and a workpiece shape after the step of configuring the solid, if necessary.

For example, when the 3D shape is removed according to processing from the workpiece shape such as etching or drilling, it is desirable to add the step of performing the calculation. It is possible to generate data of the 3D shape after the processing by adding the step.

In particular, when the present technology is applied to the etching process in manufacturing of the semiconductor apparatus or the like, a 2D shape is used as a layout shape (mask layout) of an etching mask pattern.

An initial mask layout is set on a surface before etching is performed.

Here, if the x-axis and the y-axis are set on a plane parallel to a substrate surface and the z-axis is set to be perpendicular to the substrate surface, a closed edge shape specified by data of a mask layout of the xy-plane is detected in an initial step. A plurality of closed edge shapes can be simultaneously detected on the same layout.

In the next step, a plurality of new edge coordinates generated in the z-direction are generated to include cross-sectional coordinates by comparing data of each vertex forming an edge with cross-sectional coordinates of the xz- or yz-plane defined for each edge shape.

Further, in the step of generating the 3D shape, a new plane including a plurality of generated edges is generated to configure the 3D shape.

Next, a 3D shape after processing is generated according to the step of performing logic synthesis on the configured 3D shape and the workpiece shape.

Thus, a 3D shape after etching processing can be generated.

When a plurality of closed edge shapes (boundary lines of mask patterns) on the same layer have been simultaneously detected, a 3D shape can be configured for a plurality of mask patterns included in the same layer.

In accordance with the present technology, the next 2D shape is obtained by moving and also copying or deforming a 2D shape and a solid is configured based on data of each obtained 2D shape. Thereby, it is possible to reduce an amount of data configuring a solid and represent a solid having a detailed and complex curved surface.

In particular, when a boundary line of a 2D shape has been configured to include a curve portion, it is possible to represent a solid having a detailed and complex curved surface, which is difficult to represent in the method of configuring the 3D shape based on the rectangle proposed in the related art.

For example, when the present technology is applied to manufacture of a semiconductor apparatus, it is possible to represent a shape after processing, a shape of a diffusion layer of impurities, or the like in detail. Even when these shapes have curved surfaces, data available in an analysis program can be obtained by precisely representing the curved surface.

In addition, the present technology provides a program for causing a computer to implement and execute processes corresponding to the above-described steps and a computer-readable recording medium storing the program.

It is possible to generate a 3D shape by performing each process of the above-described step in the computer using the program or the recording medium.

It is possible to configure and implement a system for generating a 3D shape, specifically, for example, a system for manufacturing a semiconductor apparatus, using a computer having a recording medium or a program.

The above-described system for manufacturing the semiconductor apparatus is configured to have hardware suitable for executing the steps of the 3D shape generation method in accordance with the present technology.

For example, the system is configured to have a central processing unit (CPU) for rapidly processing the steps, a memory having a sufficient capacity for performing a process, and a storage means for storing various data, and additionally have a display unit such as a display, and an input/output interface.

The above-described program in accordance with the present technology is configured to be operable online and/or offline.

For example, the program may be configured to be embedded in the system for generating the 3D shape in advance, and the steps in accordance with the present technology may be configured to be executed by installing the program from an outside via a recording medium or a network.

2. Embodiments

A form of the 3D shape generation method in accordance with the present technology will be described as the embodiment of the present technology.

In this embodiment, as illustrated in FIG. 1, the x-axis and the y-axis are set to be parallel to a surface of an initial wafer and the z-axis is set to be perpendicular thereto.

Figure 6:
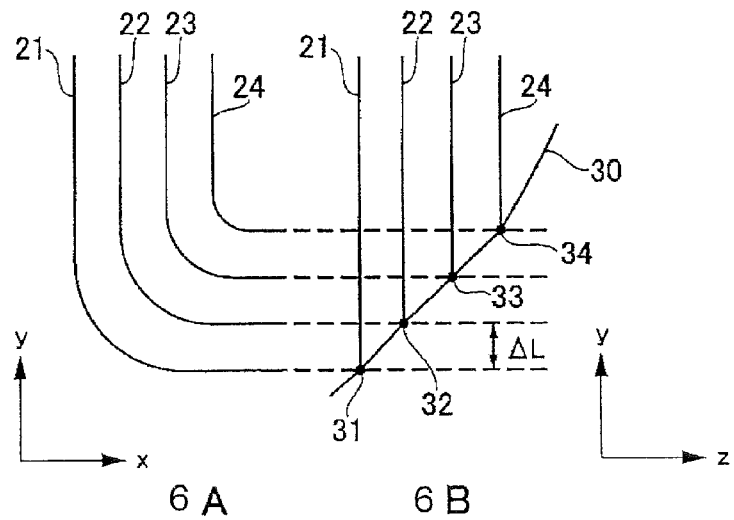
FIGS. 6A and 6B are diagrams illustrating an embodiment of a 3D shape generation method of the present technology.

In this embodiment, a 2D distribution of an initial mask layout 21 is illustrated in FIG. 6A. The mask layout 21 is described on the xy-plane parallel to the surface of the initial wafer, and made in consideration of influence of a process.

In addition, a curve 30 of 2D data in which a coordinate position of an interface to which each arbitrary point on a curve of the initial mask layout 21 should be moved is described as a position on the z-axis perpendicular to the surface of the initial wafer and a relative movement distance y from the initial mask layout 21 is illustrated in FIG. 6B.

In FIGS. 6A and 6B, the initial mask layout 21 corresponds to the curve 4 of the mask layout of FIG. 3, and the curve 30 of the 2D data corresponds to the curve 1 of FIG. 2.

Here, the intersection of the plane 2 of the cross-sectional shape in the area C occurring in a field in which a similar shape is generated along a recessed curve like the second curve portion 8 of FIG. 5 can be defined to be generated in the following case.

Figure 7:
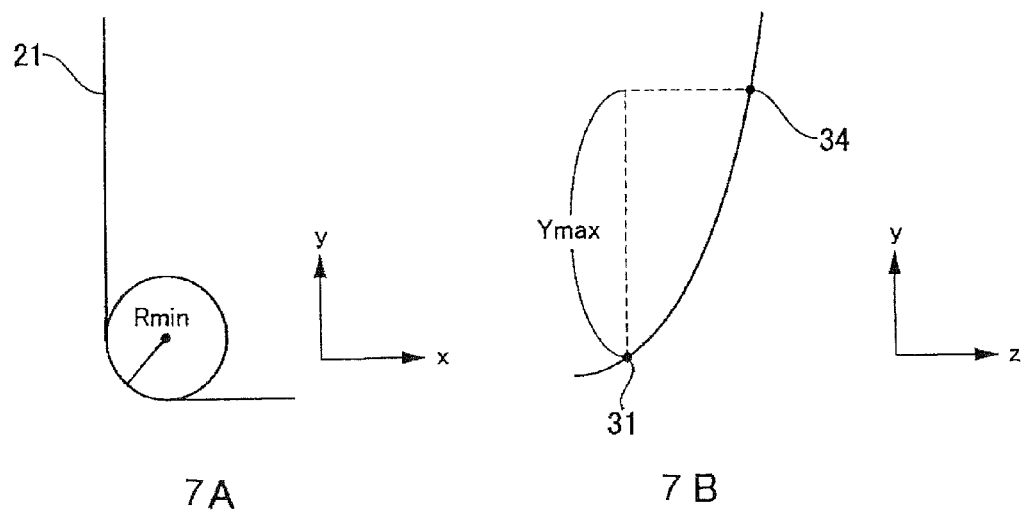
FIGS. 7A and 7B are diagrams illustrating conditions under which straight lines of FIG. 5 intersect.

A position of a minimum radius of curvature and a minimum radius Rmin for the initial mask layout 21 illustrated in FIG. 6A are illustrated in FIG. 7A. In addition, a maximum movement distance Ymax in a y-axis direction for the curve 30 of the 2D data illustrated in FIG. 6B is illustrated in FIG. 7B. At this time, the intersection of the cross-sectional shape occurs in accordance with the related art on the condition of the following Expression (1)

$$Ymax \geq Rmin \quad (1).$$

In this embodiment, a 3D shape is generated as described hereinafter.

First, as illustrated in FIG. 6B, a point 31 of coordinates on the z-axis of the initial mask layout 21 is specified for the initial mask layout 21 illustrated in FIG. 6A, and an arbitrary point 32 on the curve 30 from the point 31 is selected.

At this time, a relative distance $\Delta L$ between the point 31 and the point 32 is calculated, uniform shape deformation corresponding to the relative distance $\Delta L$ for the initial mask layout 21 is performed, and a new mask layout 22 is generated within a plane parallel to the xy-plane.

Subsequently, the mask layout 22 is moved parallel to the z-coordinate of the point 32 on the curve 30.

Thereafter, the mask layout 22 is set as the initial mask layout, $\Delta L$ is extracted for the next extraction point 33 on the curve 30, a new mask layout 23 is generated by deforming the mask layout 22, and parallel movement is performed in the z-axis direction of the mask layout 23.

Further, this step is iterated until there is no other data on the curve 30.

Figure 8:
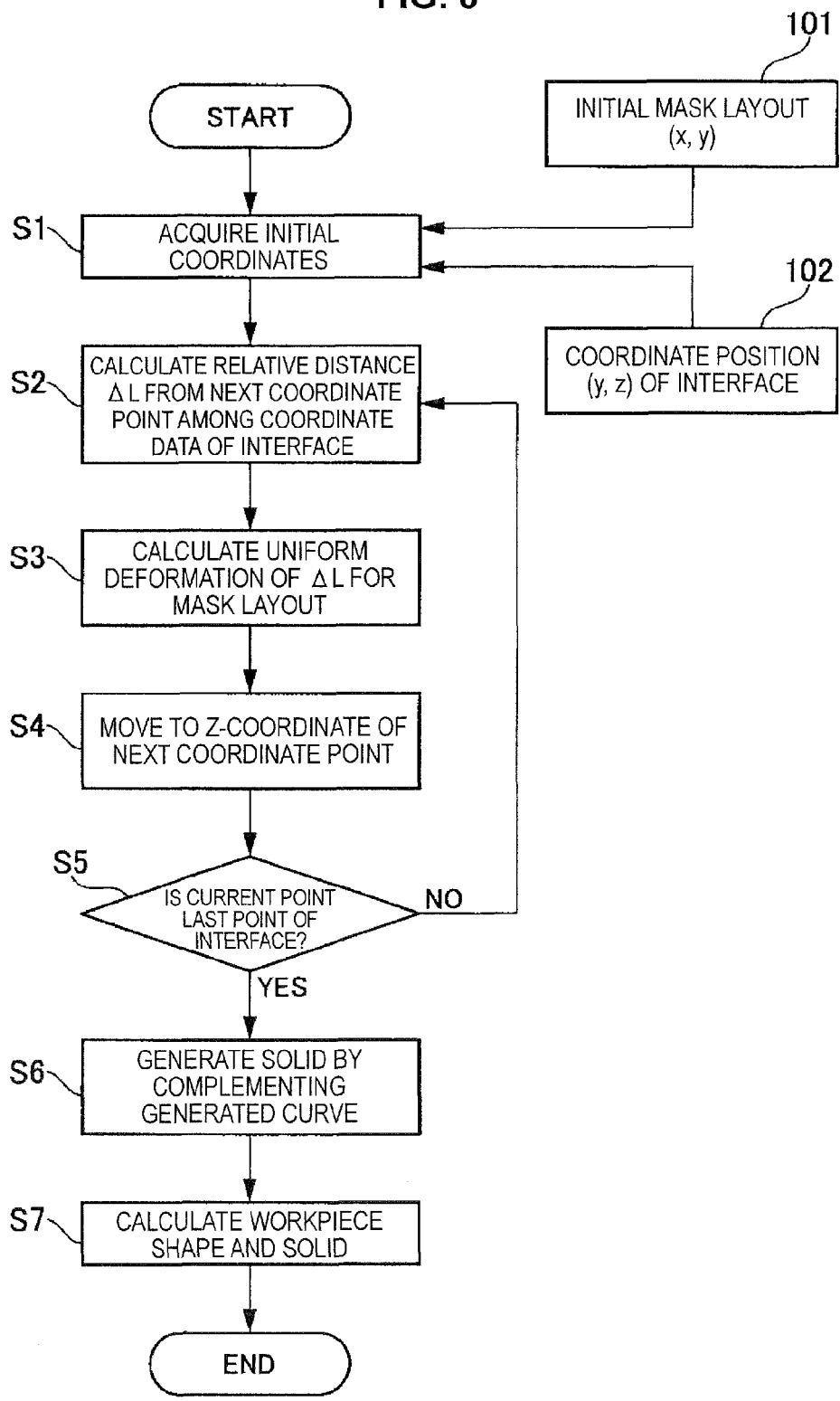
FIG. 8 is a flowchart of an embodiment of the 3D shape generation method of the present technology.

A flowchart of the above-described operation of this embodiment is illustrated in FIG. 8.

The flowchart illustrated in FIG. 8 can be executed using a simulator (information processing apparatus).

The simulator is configured by an information processing apparatus such as a computer on which a simulation program (software) for executing a simulation is implemented.

The simulation program (software) implemented on the simulator is configured to be operable online and/or offline.

First, in step S1, the simulator acquires initial coordinates. As the initial coordinates, coordinates (x, y) 101 of the initial mask layout 21 and a coordinate position (y, z) 102 of an interface are acquired.

Next, in step S2, the simulator calculates a relative distance ΔL from the next coordinate point among coordinate data of the interface.

Next, in step S3, the simulator calculates uniform shape deformation corresponding to the relative distance ΔL for the mask layout.

Next, in step S4, the simulator proceeds to step S5 by moving to the z coordinate of the next coordinate point.

Subsequently, in step S5, the simulator determines whether a current point is a last point of the interface. When the current point is not the last point, the process returns to step S2, and the relative distance ΔL is further calculated. When the current point is the last point, the process proceeds to step S6.

Next, in step S6, the simulator generates a solid by complementing a generated curve. That is, the solid is generated by complementing a portion between curves using a plurality of curves generated in the steps performed so far.

Next, in step S7, the simulator calculates a solid generated with a workpiece shape. That is, a 3D shape after processing is obtained by calculating the workpiece shape before the processing and a solid of the interface.

Thus, the 3D shape after the processing can be generated.

Figure 9:
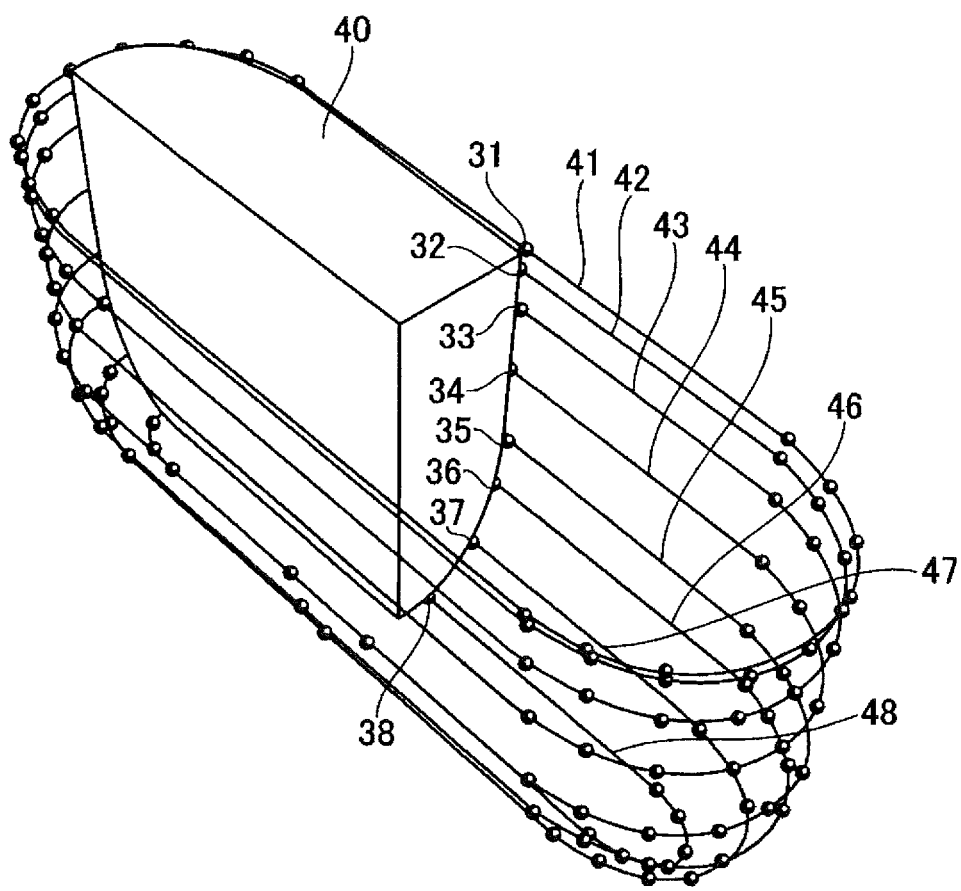
FIG. 9 is a perspective view of a solid generated in accordance with an embodiment of the present technology.

A plurality of mask layout curves generated as the result obtained by performing the above-described operation on a solid modeling system and a perspective view of a solid 40 generated by complementing the curves are illustrated in FIG. 9.

Points 31 to 38 of FIG. 9 are set to be similar to the points 31 to 34 of FIG. 6B.

Curves 41 to 48 of FIG. 9 are obtained by connecting the points 31 to 38 to the same z-coordinate points, and set to be similar to the mask layouts 21 to 24 of FIG. 6A.

The solid 40 of FIG. 9 is a quarter of the solid generated by the points 31 to 38 and the curves 41 to 48.

A curved surface of a sidewall of the solid 40 is reproduced with high precision in a shape obtained by the above-described shape simulation or measurement means.

Figure 10:
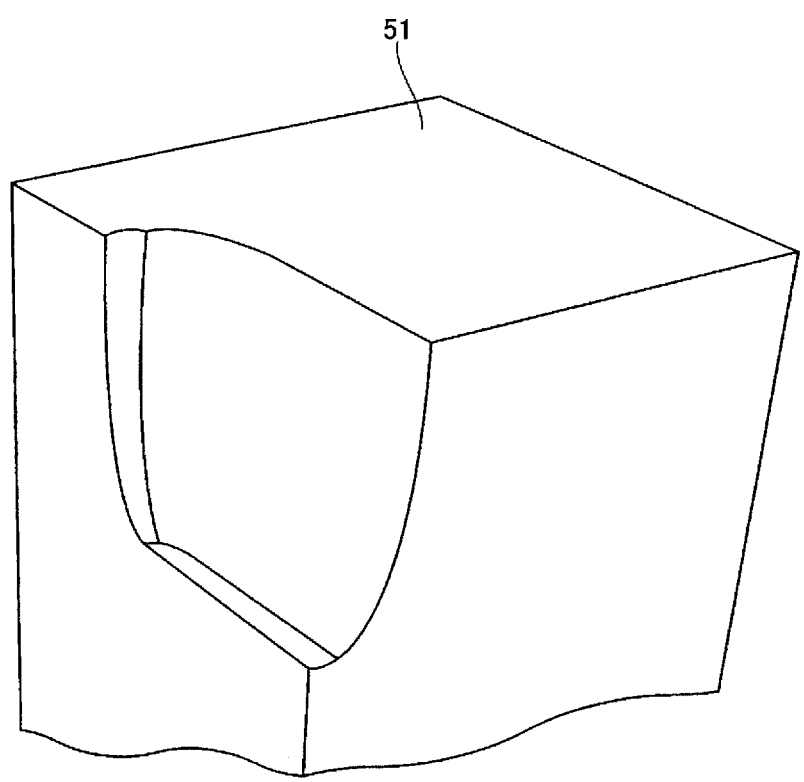
FIG. 10 is a diagram illustrating a final shape after a workpiece shape and the solid of FIG. 9 have been calculated.

Here, a final shape when a cuboid 51 has been generated as a workpiece shape for the solid 40 of FIG. 9 and logic synthesis (in this case, SUBTRACT) on the solid modeling system has been performed is illustrated in FIG. 10.

Because the intersection of the cross-sectional shape does not occur even with respect to a recessed mask shape like the second curve portion 8 that becomes a problem in the shape of FIG. 5 by adopting the 3D shape generation method of the present technology, a shape after processing is generated with high precision as illustrated in FIG. 10.

Although the intersection of the cross-sectional shape occurs in the related art under the condition of Expression (1) described above, it is possible to generate a 3D shape with no problem in the 3D shape generation method of this embodiment.

In accordance with this embodiment described above, a 3D shape can be generated from a curve group (wireframe) such as the curves 41 to 48 of FIG. 9 obtained by moving and deforming the mask layout. Thereby, a 3D shape can be represented using a relatively small data amount, and a detailed and complex solid having a curved surface can also be represented.

Accordingly, in accordance with this embodiment, because it is possible to generate data in which an analysis mesh in an analysis program is easily generated even in the detailed and complex solid having the curved surface, accurate analysis can be performed even when a boundary shape is complex.

The above-described embodiment is a shape change in which the mask layout is reduced and deformed within the xy-plane according to movement in the z-direction.

In the present technology, the shape change of the 2D shape is not limited to the reduction deformation. The present technology can be applied to a shape change in which enlargement deformation, movement deformation in one direction, or other deformation is made.

In addition, in the above-described embodiment, the 3D shape generation method of the present technology is applied to a process of manufacturing a semiconductor apparatus.

The 3D shape generation method of the present technology is not limited to the process of manufacturing the semiconductor apparatus, and is applicable to generation of a 3D shape in other fields.

The present technology is applicable to a 3D shape of a configuration of a gradual change in which a shape change in a movement direction (1D direction) of the 2D shape is not a random change or a small change.

Although the 1D direction is designated as a direction perpendicular to the initial wafer in the process of manufacturing the semiconductor apparatus, the 1D direction can be designated as a horizontal direction or a diagonal direction.

In addition, when the present technology is applicable, for example, a hole may be emptied by injecting liquids or solids in a specific direction (upward/downward, lateral, or diagonal) for solids (a rock, a plate, and the like), the materials of which are determined to a certain extent.

In addition, when the present technology is applicable, for example, a surface may develop according to adhesion, reaction, or the like based on an initial shape. In this case, it is possible to obtain data for use in the generation method of the present technology by obtaining a state after development in shape simulation or measuring a shape of the state after the development that is actually created.

Additionally, the present technology may also be configured as below.

(1) A method of generating a three-dimensional (3D) shape by specifying a boundary between materials, including:
  acquiring numerical data of a boundary line of a two-dimensional (2D) shape in a plane;
  generating a next 2D shape by moving the 2D shape in a direction intersecting the plane based on numerical data specifying a shape of the boundary and also by copying or deforming the 2D shape; and
  configuring a solid based on data of a generated 2D shape.

(2) The method of generating a 3D shape according to (1), wherein the boundary line of the 2D shape includes a curve portion.

(3) The method of generating a 3D shape according to (1) or (2), further comprising:
  calculating a workpiece shape and the solid after configuring the solid.

(4) The method of generating a 3D shape according to any one of (1) to (3), wherein the 2D shape is a layout shape of an etching mask pattern.

(5) The method of generating a 3D shape according to (4), wherein the solid is configured for a plurality of mask patterns included in the same layer.

(6) The method of generating a 3D shape according to any one of (1) to (5), wherein the direction intersecting the plane is designated as a direction perpendicular to the plane.

(7) A program for causing a computer to implement and execute the method of generating a 3D shape according to any one of (1) to (6).

(8) A computer-readable recording medium storing a program for causing a computer to implement and execute the method of generating a 3D shape according to any one of (1) to (6).

It should be understood by those skilled in the art that various modifications, combinations, sub-combinations and alterations may occur depending on design requirements and other factors insofar as they are within the scope of the appended claims or the equivalents thereof.

The present disclosure contains subject matter related to that disclosed in Japanese Priority Patent Application JP 2012-006749 filed in the Japan Patent Office on Jan. 17, 2012, the entire content of which is hereby incorporated by reference.

What is claimed is:

1. A method of generating a three-dimensional (3D) shape by specifying a boundary between materials, comprising:
    acquiring numerical data of a boundary line of a first two-dimensional (2D) shape in a plane;
    generating a second 2D shape by moving the first 2D shape in a direction intersecting the plane based on the acquired numerical data specifying a shape of the boundary and by deforming the first 2D shape; and
    configuring a solid based on data of the generated second 2D shape.

2. The method of generating a 3D shape according to claim 1, wherein the boundary line of the first 2D shape includes a curve portion.

3. The method of generating a 3D shape according to claim 1, further comprising:
    calculating a workpiece shape and the configured solid.

4. The method of generating a 3D shape according to claim 1, wherein the first 2D shape is a layout shape of an etching mask pattern.

5. The method of generating a 3D shape according to claim 4, wherein the solid is configured for a plurality of mask patterns included in a layer.

6. The method of generating a 3D shape according to claim 1, wherein the direction intersecting the plane is designated as a direction perpendicular to the plane.

7. A method for generating a three dimensional (3D) shape by specifying a boundary between materials, comprising:
    acquiring numerical data of a boundary line of a first two dimensional (2D) shape in a plane;
    generating a second 2D shape by moving the first 2D shape in a direction intersecting the plane based on the acquired numerical data specifying a shape of the boundary between materials and by deforming the first 2D shape; and
    configuring a solid based on data of the generated second 2D shape.

8. A non-transitory computer-readable recording medium having stored thereon a set of computer-executable instructions, for causing a computer to perform steps comprising:
    acquiring numerical data of a boundary line of a first two dimensional (2D) shape in a plane;
    generating a second 2D shape by moving the first 2D shape in a direction intersecting the plane based on the acquired numerical data specifying a shape of a boundary between materials and by deforming the first 2D shape; and
    configuring a solid based on data of the generated second 2D shape.

* * * * *